US009543249B1

(12) United States Patent
Hu (10) Patent No.: US 9,543,249 B1
(45) Date of Patent: Jan. 10, 2017

(54) PACKAGE SUBSTRATE WITH LATERAL COMMUNICATION CIRCUITRY

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 14/859,464

(22) Filed: Sep. 21, 2015

(51) Int. Cl.
*H01L 23/34* (2006.01)
*H01L 23/538* (2006.01)
*H01L 25/065* (2006.01)

(52) U.S. Cl.
CPC ....... *H01L 23/5383* (2013.01); *H01L 25/0655* (2013.01)

(58) Field of Classification Search
CPC ............. H01L 23/5383; H01L 25/0655; H01L 23/5386; H01L 23/528; H01L 23/065; H01L 23/065526
USPC .................................................. 257/723, 758
See application file for complete search history.

(56) References Cited

U.S. PATENT DOCUMENTS

| | | | | |
|---|---|---|---|---|
| 5,111,278 A * | 5/1992 | Eichelberger | ......... | H01L 23/473 257/698 |
| 5,157,589 A * | 10/1992 | Cole, Jr. | .................. | H01L 23/13 257/700 |
| 5,497,033 A * | 3/1996 | Fillion | ................... | H01L 21/568 257/700 |
| 5,565,706 A * | 10/1996 | Miura | ..................... | H01L 23/13 257/691 |
| 5,870,289 A * | 2/1999 | Tokuda | ............... | H01L 21/6835 174/260 |
| 6,025,995 A * | 2/2000 | Marcinkiewicz | ... | H01L 23/5389 257/700 |
| 6,271,469 B1 * | 8/2001 | Ma | .......................... | H01L 21/56 174/521 |
| 6,495,914 B1 * | 12/2002 | Sekine | ................ | H01L 23/5389 257/706 |
| 7,615,856 B2 * | 11/2009 | Sakai | ....................... | H01Q 1/22 257/685 |
| 8,901,748 B2 | 12/2014 | Manusharow et al. | | |
| 2003/0141105 A1 * | 7/2003 | Sugaya | ................... | H01L 21/56 174/256 |
| 2003/0227079 A1 * | 12/2003 | Chia | ................... | H01L 23/3114 257/723 |
| 2012/0161331 A1 * | 6/2012 | Gonzalez | ................ | H01L 24/19 257/774 |
| 2014/0159228 A1 * | 6/2014 | Teh | ......................... | H01L 25/18 257/734 |

* cited by examiner

*Primary Examiner* — Nitin Parekh
(74) *Attorney, Agent, or Firm* — Hauptman Ham, LLP (57) ABSTRACT

A package substrate having a first redistribution layer (RDL1) and a second redistribution layer (RDL2) is disclosed for a multichip package. The first redistribution layer RDL1 is built according to a first design rule. The second redistribution layer RDL2 is built according to a second design rule and configured on a bottom of the first redistribution layer RDL1. The second design rule has a lower circuitry density than the first design rule has. A lateral communication circuitry is built within the first redistribution layer RDL1 according to the first design rule adaptive for bridging neighboring chips which are configured on a top surface of the first redistribution layer RDL1.

20 Claims, 10 Drawing Sheets

PACKAGE SUBSTRATE WITH LATERAL COMMUNICATION CIRCUITRY

BACKGROUND

Technical Field

The present invention relates to a package substrate for a multichip package; especially relates to a package substrate having lateral communication circuitry for signal communication between chips within the multichip package.

Description of Related Art

Figure 1:
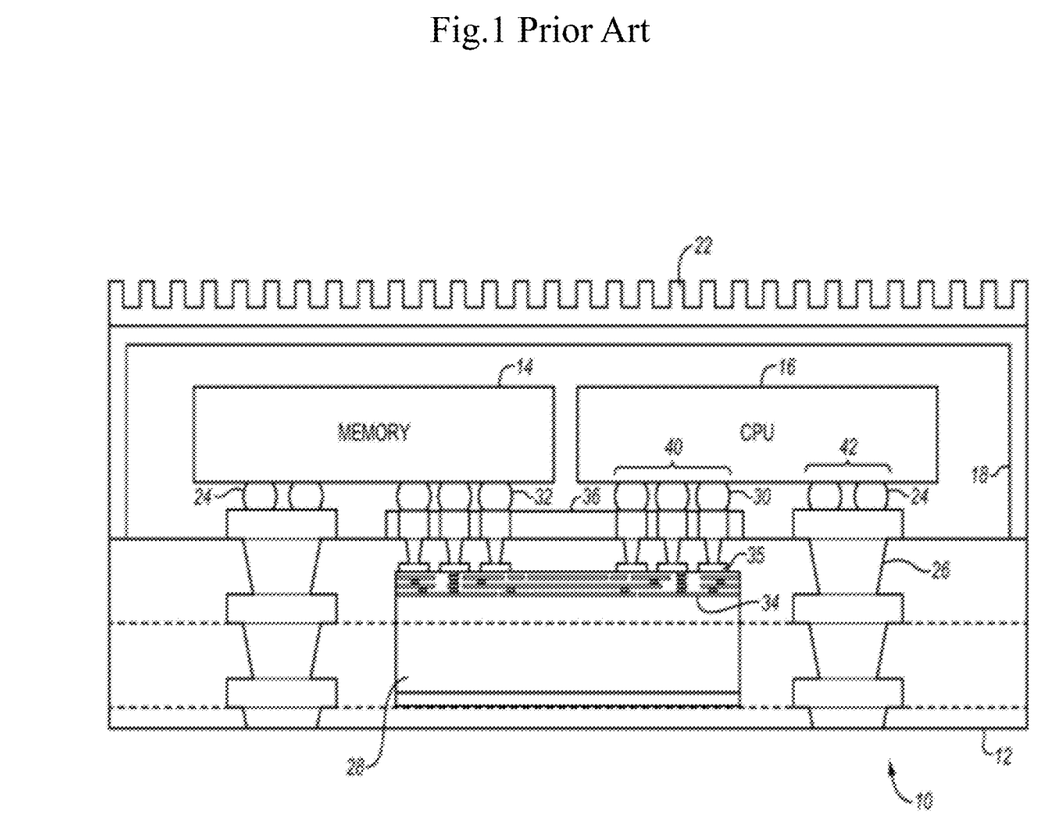
FIG. 1 shows a prior art.

FIG. 1 Shows a Prior Art.

FIG. 1 shows a prior art U.S. Pat. No. 8,901,748. It disclosed a semiconductor package 10 which has an embedded interconnect bridge element 28 with circuitry 34 and metal pad 35 for signal communication between chips 14, 16 configured on top of the package substrate 12. The package 10 is formed on a package substrate 12 that carries the semiconductor dies 14, 16. A cover 18 covers the substrate and the two dies 14, 16. A cooling fin 22 is attached to the top surface of the cover 18. The embedded interconnect bridge element 28 provides circuitry 34 and metal pad 35 for communication between the CPU 16 and memory 14 within the package. The two dies 14 and 16 are coupled through solder balls 24 and metal vias 26 to a power source (not shown) outside the package. The interconnect bridge element 28 provides connectors 30 to the CPU die 16 and provides connectors 32 to the memory 14. The CPU 16 has a first interconnect area 40 closest to the memory 14 for connecting through the embedded bridge element 28 to the memory 14. The CPU 16 has a second interconnect area 42 for connecting with metal vias 26 for power and external data input and output.

The embedded interconnect bridge element 28 disclosed in the prior art needs to be prepared in a separate fabrication process and then embedded in the package substrate, several considerations such as fabrication, singulation, registration and coefficient of thermal expansion (CTE) problem . . . etc., need to be taken care. A simpler structure and fabricating process with higher circuitry density and higher reliability for a multichip package need to be developed.

DETAILED DESCRIPTION OF THE INVENTION

A simplified multichip interconnector structure and more reliable package substrate for a multichip package is developed where a lateral communication circuitry is built in the package substrate on top side to provide a shortest circuitry path for signal communication between neighboring chips on top of the package substrate.

Figure 2:
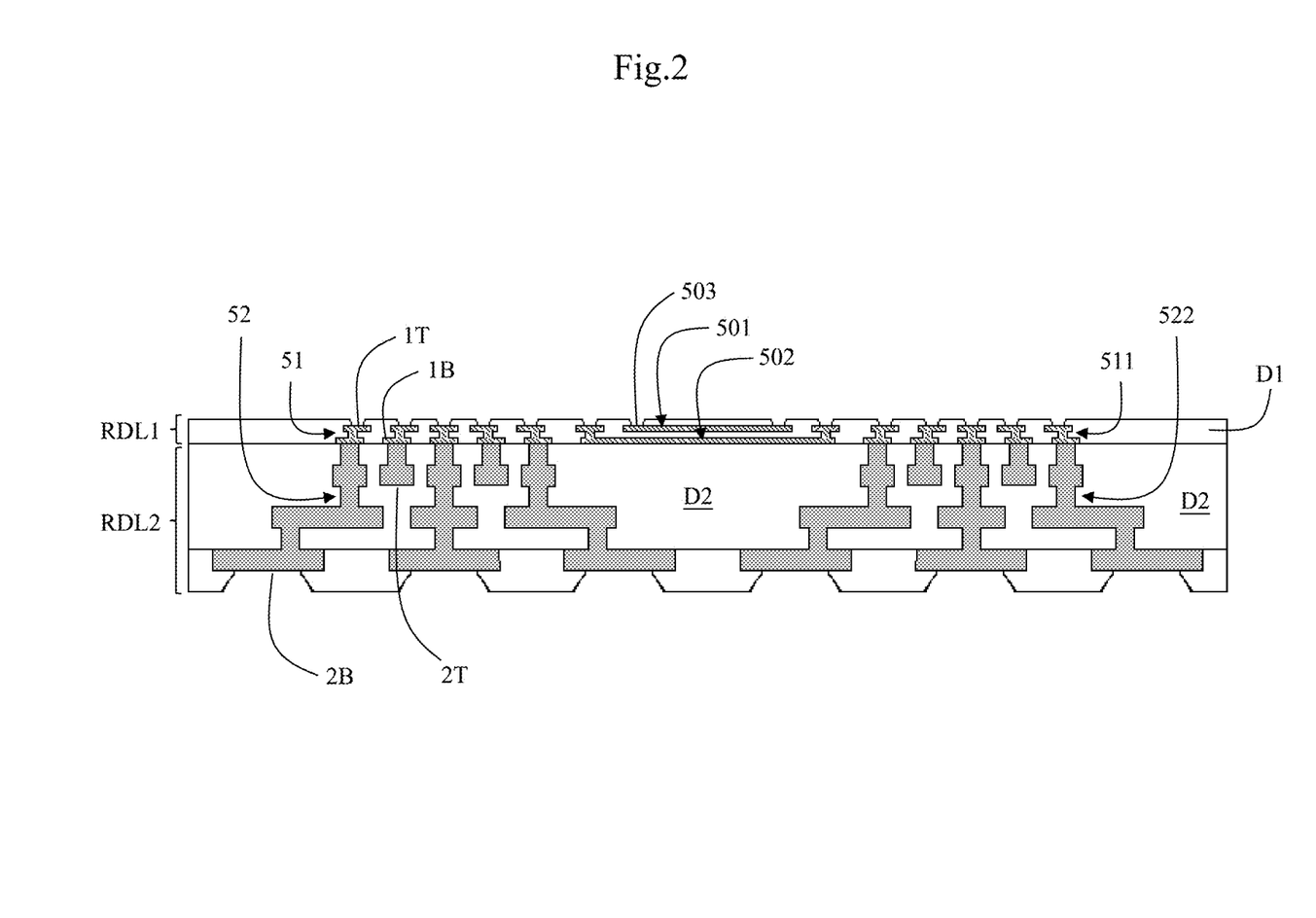
FIG. 2 shows a first embodiment according to the present invention.

FIG. 2 Shows a First Embodiment According to the Present Invention.

FIG. 2 shows a package substrate for a multichip package. Two redistribution layers RDL1, and RDL2 are built in this embodiment. A first redistribution layer RDL1 is built according to a first design rule with a relative finer circuitry, higher density technology. The first redistribution layer RDL1 has a first redistribution circuitry embedded in a first dielectric layer D1. The first redistribution circuitry further comprises a first left redistribution circuitry 51 and a first right redistribution circuitry 511. The first redistribution circuitry has a plurality of first top metal pads 1T exposed adaptive for at least one chip to mount. The first redistribution circuitry has a plurality of first bottom metal pads 1B with a density lower than a density of the first top metal pads 1T. The circuitry fans out from the first top metal pads 1T towards the first bottom metal pads 1B.

A second redistribution layer RDL2 is built according to a second design rule with a relative wider line width, lower density than that of the first design rule. The second redistribution layer RDL2 has a second redistribution circuitry embedded in a second dielectric layer D2. The second redistribution circuitry further comprises a second left redistribution circuitry 52 and a second right redistribution circuitry 522. The second left redistribution circuitry 52 is configured on a bottom of the first left redistribution circuitry 51 and electrically coupled to the first left redistribution circuitry 51. The second right redistribution circuitry 522 is configured on a bottom of the first right redistribution circuitry 511 and is electrically coupled to the first right redistribution circuitry 511. The second redistribution circuitry has a plurality of second top metal pads 2T and a plurality of second bottom metal pads 2B. The plurality of second bottom metal pads 2B has a density lower than a density of the plurality of the second top metal pads 2T.

A lateral communication circuitry 501, 502 is built according to the first design rule, configured in the first redistribution layer RDL1 and configured between the first left redistribution circuitry 51 and the first right redistribution circuitry 511. The lateral communication circuitry 501, 502 has a plurality of top metal pads 503 exposed on top adaptive for bridging neighboring chips which are configured on a top surface of the first redistribution layer RDL1 in a later step. The second redistribution circuitry 52, 522 has a relative wider line width and lower circuitry density than the first redistribution circuitry 51, 511 has.

Figure 3:
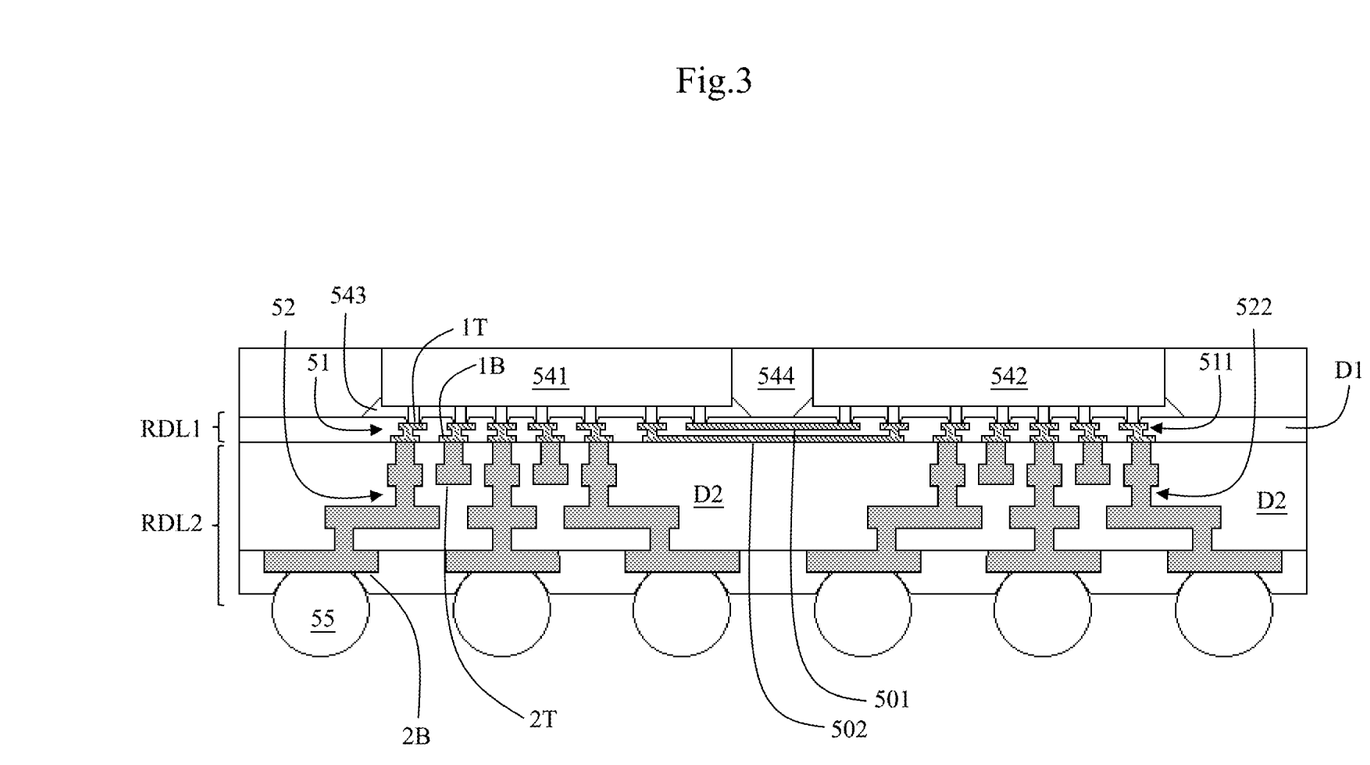
FIG. 3 shows a multichip package using the package substrate of FIG. 2.

FIG. 3 Shows a Multichip Package Using the Package Substrate of FIG. 2.

A pair of chips 541, 542 are, as an example, mounted on a top surface of the first redistribution layer RDL1. An underfill material 543 is filled in the space between the chips 541, 542 and a top surface of the first dielectric layer D1. A molding compound 544 is then applied to encapsulate the chips 541, 542 for a further protection.

Figure 4A:
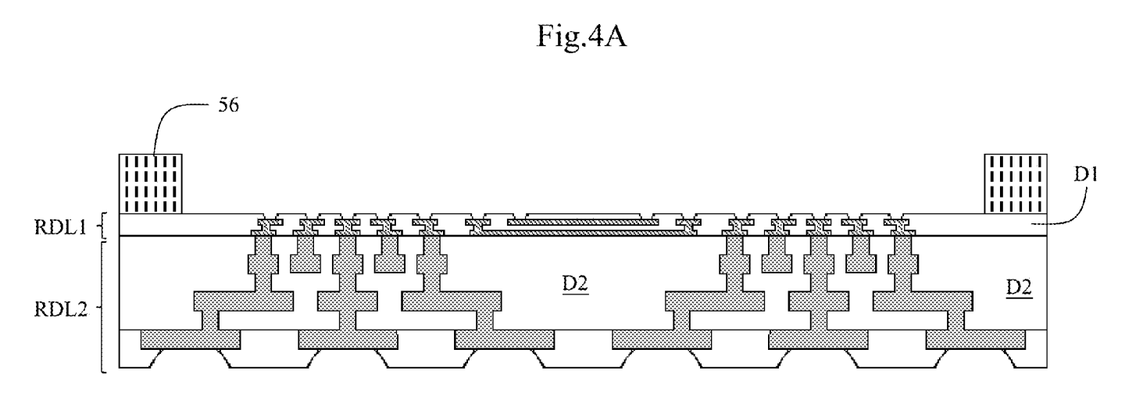
FIGS. 4A~4B show a first modified embodiment for FIG. 2.
Figure 4B:
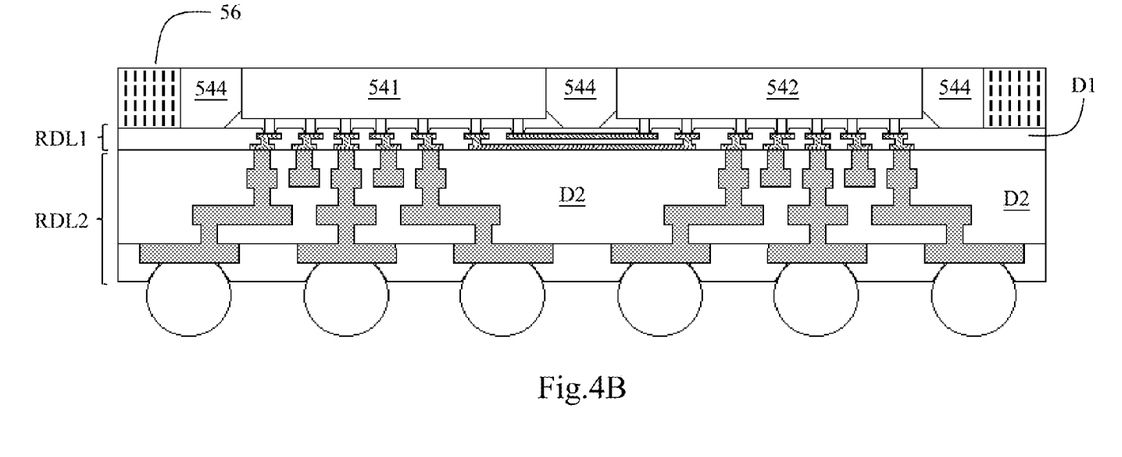

FIGS. 4A~4B Show a First Modified Embodiment for FIG. 2.

FIG. 4A shows a supporting frame 56 in a rectangular shape is configured on a top surface of the first redistribution layer RDL1 for strengthening the thin film package substrate, as disclosed in the present invention, which has a thickness dimension in a level of millimeter (mm) or micrometer (um). The material of the supporting frame 56 can be one of metal, glass, ceramic, or silicon.

FIG. 4B Shows a Multichip Package Using the Package Substrate of FIG. 4A

FIG. 4B shows that a pair of chips 541, 542 are, as an example, mounted on a top surface of the first redistribution layer RDL1. An underfill material 543 is filled in the space between the chips 541, 542 and a top surface of the first dielectric layer D1. A molding compound 544 is then applied to encapsulate the chips 541, 542 for a further protection. FIG. 4B shows the supporting frame 56 encircles at the two chips 541, 542.

Figure 5A:
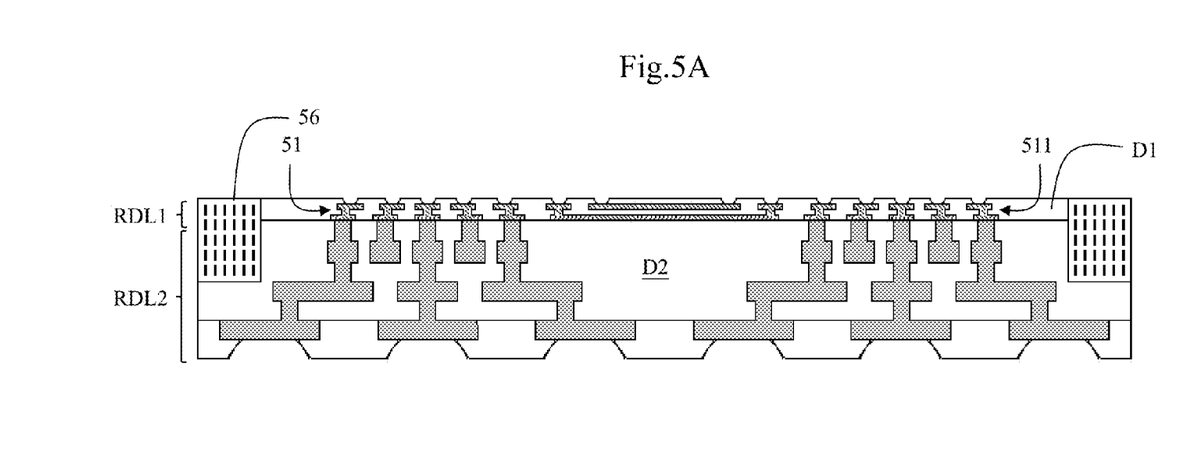
FIGS. 5A~5B show a second modified embodiment for FIG. 2.
Figure 5B:
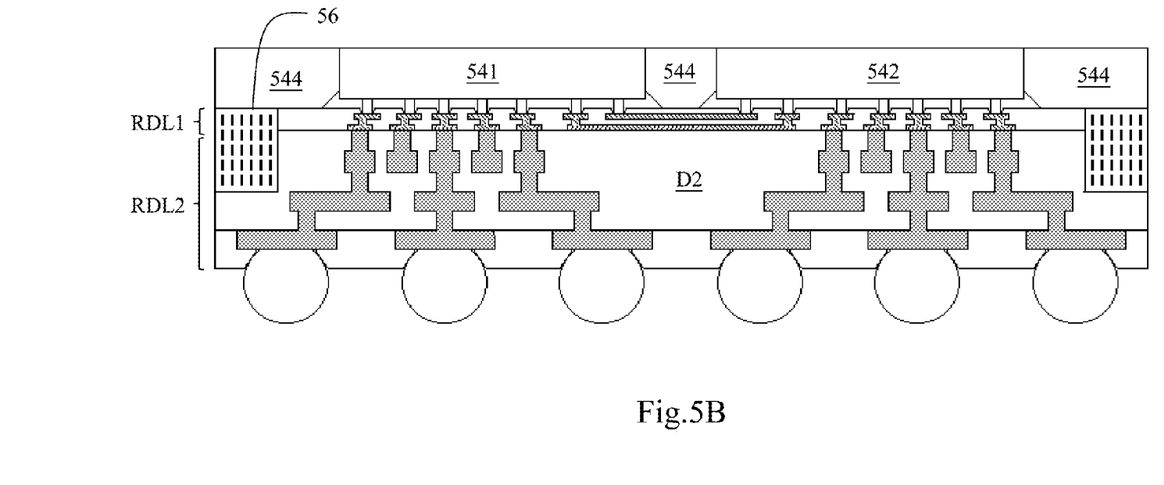

FIGS. 5A~5B Show a Second Modified Embodiment for FIG. 2.

FIG. 5A shows a supporting frame 56 in a rectangular shape is embedded in the dielectric layers D1, D2 for strengthening the thin film package substrate, as disclosed in the present invention, which has a thickness dimension in a level of millimeter (mm) or micrometer (um). The material of the supporting frame 56 can be one of metal, glass, ceramic, or silicon. The supporting frame 56 is fully embedded as an example in the figure, however, partially embedded (not shown) can also be chosen according to design choices.

FIG. 5B Shows a Multichip Package Using the Package Substrate of FIG. 5A

FIG. 5B shows that a pair of chips 541, 542 are, as an example, mounted on a top surface of the first redistribution layer RDL1. An underfill material 543 is filled in the space between the chips 541, 542 and a top surface of the first dielectric layer D1. A molding compound 544 is then applied to encapsulate the chips 541, 542 for a further protection. FIG. 5B shows the supporting frame 56 encircles at least the first redistribution circuitry 51, 511.

Figure 6:
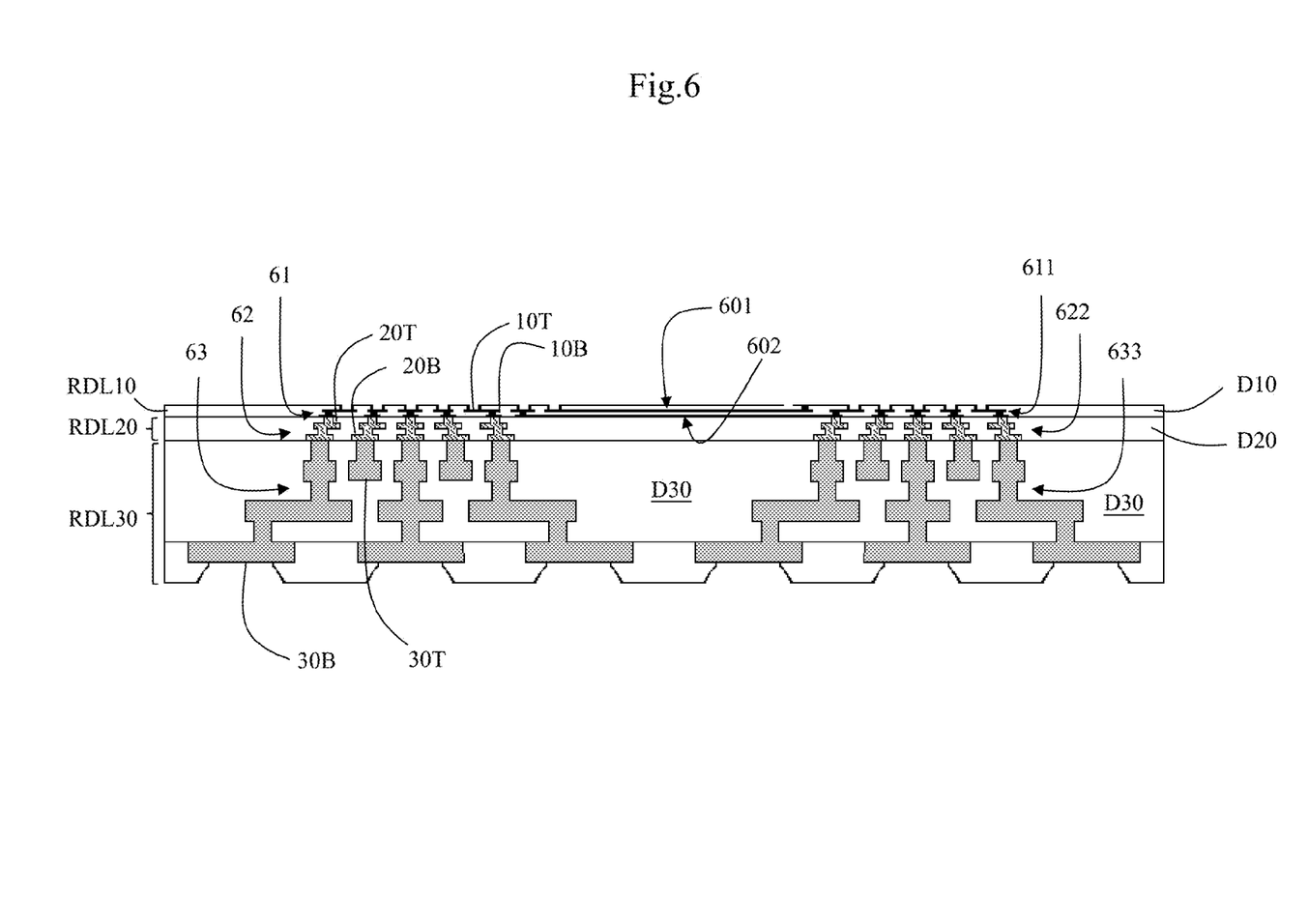
FIG. 6 shows a second embodiment according to the present invention.

FIG. 6 Shows a Second Embodiment According to the Present Invention.

FIG. 6 shows a package substrate for a multichip package. Three redistribution layers RDL10, RDL20, and RDL30 are built in this embodiment. A first redistribution layer RDL10 is built according to a first design rule with a relative finer circuitry, higher density technology. The first redistribution layer RDL10 has a first redistribution circuitry embedded in a first dielectric layer D10. The first redistribution circuitry further comprises a first left redistribution circuitry 61 and a first right redistribution circuitry 611. The first redistribution circuitry has a plurality of first top metal pads 10T exposed adaptive for at least a chip to mount. The first redistribution circuitry has a plurality of first bottom metal pads 10B with a density lower than a density of the first top metal pads 10T.

A second redistribution layer RDL2 is built according to a second design rule with a relative wider line width, lower density than that of the first design rule. The second redistribution layer RDL2 has a second redistribution circuitry embedded in a second dielectric layer D20. The second redistribution circuitry further comprises a second left redistribution circuitry 62 and a second right redistribution circuitry 622. The second left redistribution circuitry 62 is configured on a bottom of the first left redistribution circuitry 61 and electrically coupled to the first left redistribution circuitry 61. The second right redistribution circuitry 622 is configured on a bottom of the first right redistribution circuitry 611 and is electrically coupled to the first right redistribution circuitry 611. The second redistribution circuitry has a plurality of second top metal pads 20T and a plurality of second bottom metal pads 20B. The plurality of second bottom metal pads 20B has a density lower than a density of the plurality of second top metal pads 20T.

A third redistribution layer RDL30 is built according to a third design rule with a relative wider line width, lower density than that of the second design rule. The third redistribution layer RDL30 has a third redistribution circuitry embedded in a third dielectric layer D30. The third redistribution circuitry further comprises a third left redistribution circuitry 63 and a third right redistribution circuitry 633. The third left redistribution circuitry 63 is configured on a bottom of the second left redistribution circuitry 62 and electrically coupled to the second left redistribution circuitry 62. The third right redistribution circuitry 633 is configured on a bottom of the second right redistribution circuitry 622 and is electrically coupled to the second right redistribution circuitry 622.

The third redistribution circuitry has a plurality of third top metal pads 30T and a plurality of third bottom metal pads 30B. The plurality of third bottom metal pads 30B has a density lower than a density of the plurality of the third top metal pads 30T.

A lateral communication circuitry 601, 602 is built according to the first design rule, configured in the first redistribution layer RDL10 and configured between the first left redistribution circuitry 61 and the first right redistribution circuitry 611. The lateral communication circuitry 601, 602 has a plurality of top metal pads 10T exposed on top adaptive for bridging neighboring chips which are configured on a top surface of the first redistribution layer RDL10 in a later step.

The second redistribution circuitry 62, 622 has a relative wider line width and lower circuitry density than the first redistribution circuitry 61, 611 has. The third redistribution circuitry 63, 633 has a relative wider line width and lower circuitry density than the second redistribution circuitry 62, 622 has.

Figure 7:
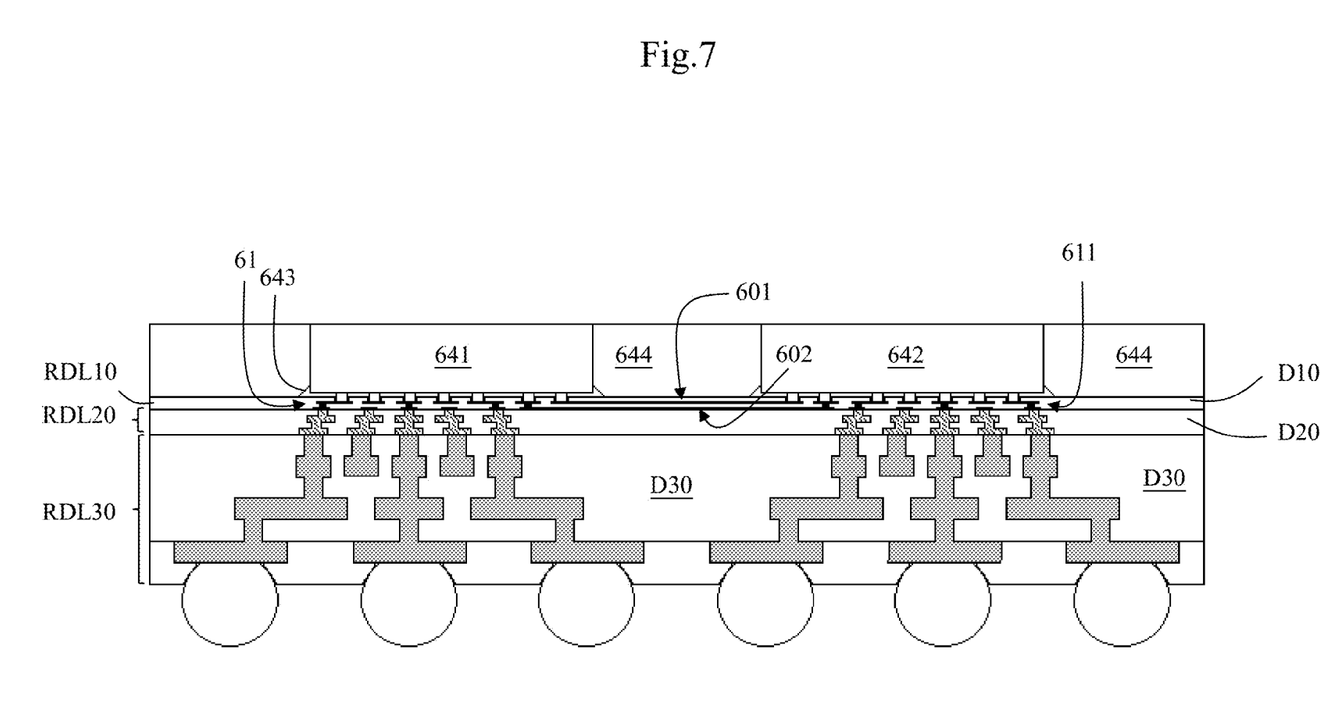
FIG. 7 shows a multichip package using the package substrate of FIG. 6.

FIG. 7 Shows a Multichip Package Using the Package Substrate of FIG. 6.

A pair of chips 641, 642 are, as an example, mounted on a top surface of the first redistribution layer RDL10. An underfill material 643 is filled in the space between the chip 641, 642 and a top surface of the first dielectric layer D10. A molding compound 644 is then applied to encapsulate the chips 641, 642 for a further protection.

Figure 8A:
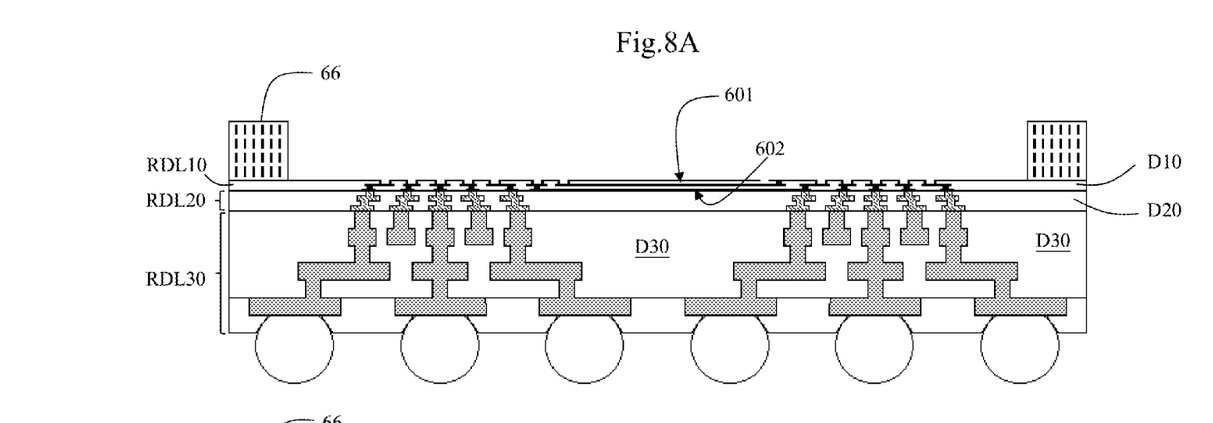
FIGS. 8A~8B show a first modified embodiment for FIG. 7.
Figure 8B:
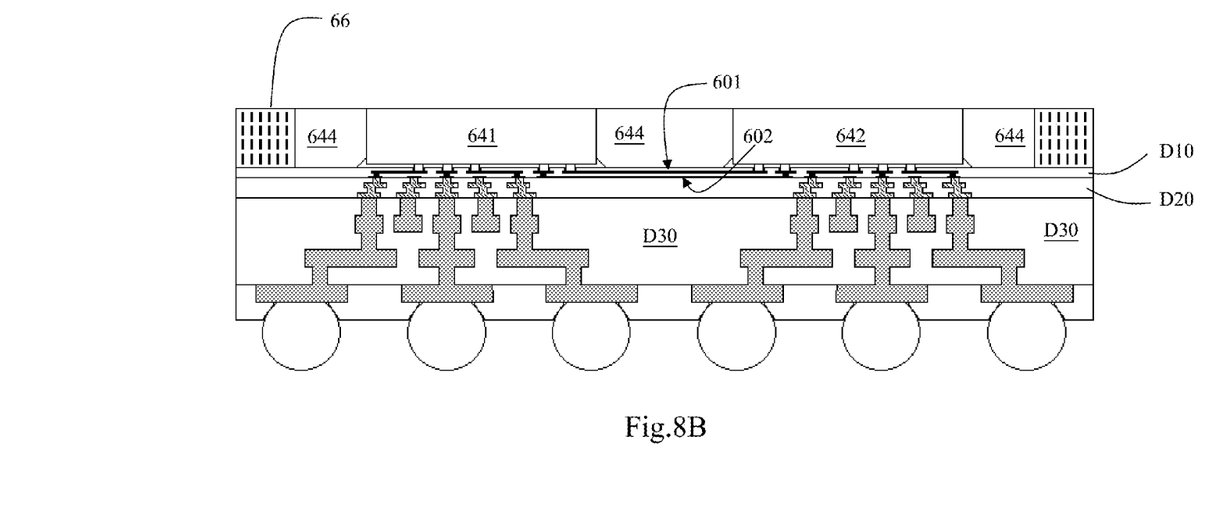

FIGS. 8A~8B Show a First Modified Embodiment for FIG. 7.

FIG. 8A shows a supporting frame 66 in a rectangular shape is configured on a top surface of the first redistribution layer RDL10 for strengthening the thin film package substrate, as disclosed in the present invention, which has a thickness dimension in a level of millimeter (mm) or micrometer (um). The material of the supporting frame 66 can be one of metal, glass, ceramic, or silicon.

FIG. 8B Shows a Multichip Package Using the Package Substrate of FIG. 8A

FIG. 8B shows that a pair of chips 641, 642 are, as an example, mounted on a top surface of the first redistribution layer RDL10. An underfill material 643 is filled in the space between the chip 641, 642 and a top surface of the first dielectric layer D10. A molding compound 644 is then applied to encapsulate the chips 641, 642 for a further protection. FIG. 8B shows the supporting frame 66 encircles at the two chips 641, 642.

Figure 9A:
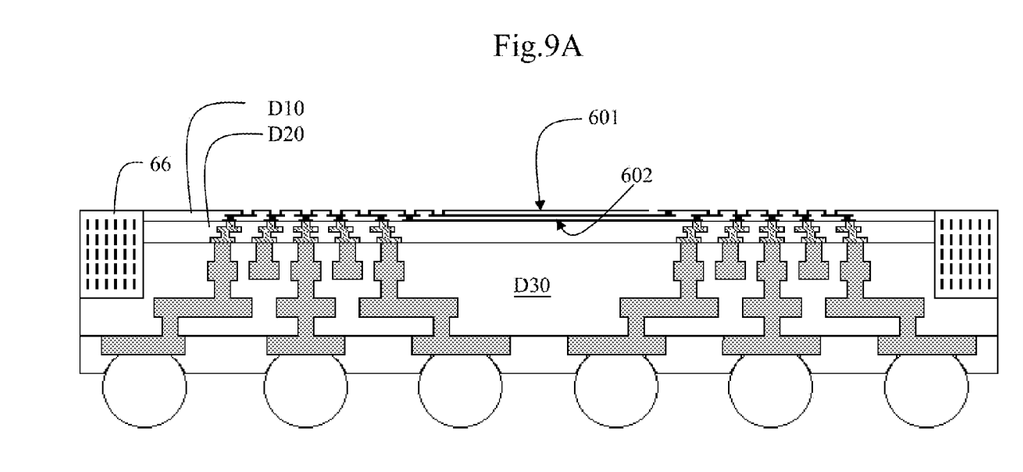
FIGS. 9A~9B show a second modified embodiment for FIG. 7.
Figure 9B:
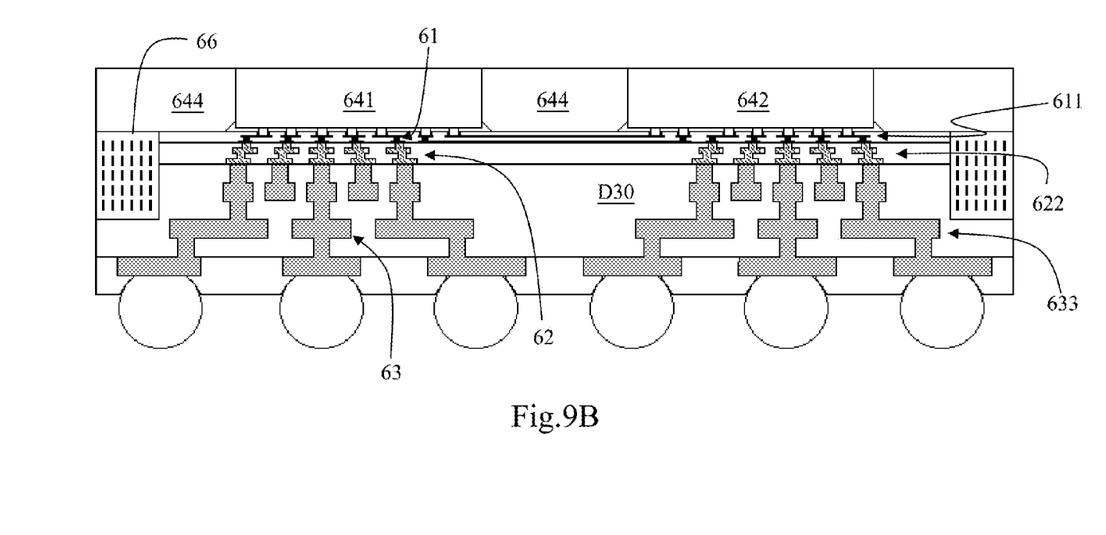

FIGS. 9A~9B Show a Second Modified Embodiment for FIG. 2.

FIG. 9A shows a supporting frame 66 in a rectangular shape is embedded in the dielectric layers D10, D20, D30 for strengthening the thin film package substrate, as disclosed in the present invention, which has a thickness dimension in a level of millimeter (mm) or micrometer (um). The material of the supporting frame 66 can be one of metal, glass, ceramic, or silicon. The supporting frame 66 is fully embedded as an example in the figure, however, partially embedded (not shown) can also be chosen according to design choices.

FIG. 9B Shows a Multichip Package Using the Package Substrate of FIG. 9A

FIG. 9B shows that a pair of chips 641, 642 are, as an example, mounted on a top surface of the first redistribution layer RDL10. An underfill material 643 is filled in the space between the chip 641, 642 and a top surface of the first dielectric layer D10. A molding compound 644 is then applied to encapsulate the chips 641, 642 for a further protection. FIG. 9B shows the supporting frame 66 encircles at least the first redistribution circuitry 61, 611 and the second redistribution circuitry 62, 622.

Figure 10A:
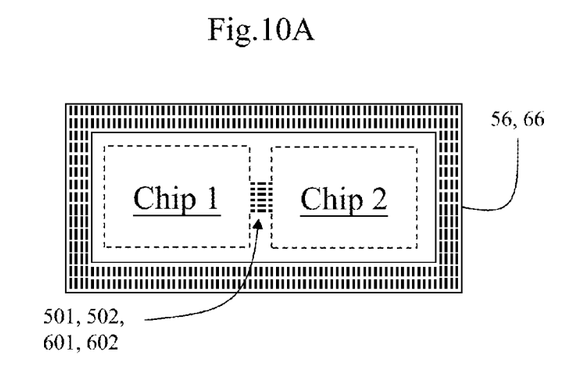
FIGS. 10A~10B show a top view of either FIG. 4B or FIG. 8B.
Figure 10B:
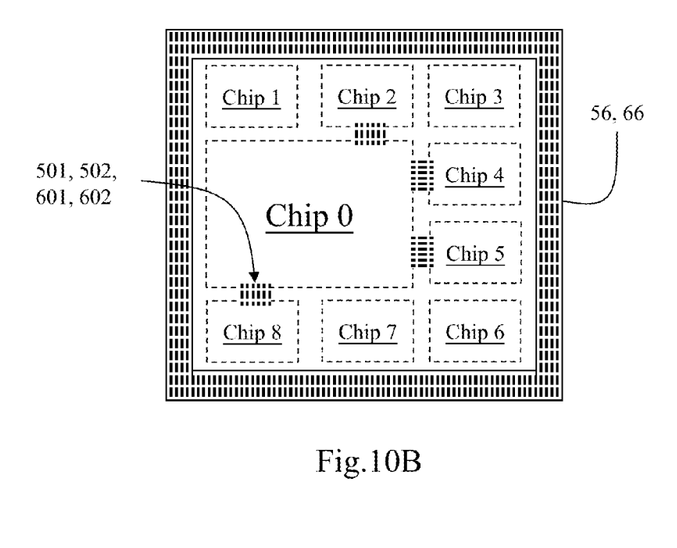

FIGS. 10A~10B Show a Top View of Either FIG. 4B or FIG. 8B.

FIG. 10A shows the supporting frame 56, 66 enclosed at least two chips—chip1 and chip2. A plurality of lateral communication circuitry 501, 502, 601, 602 are configured for signal communication between the two chips.

FIG. 10B shows the supporting frame 56, 66 enclosed more chips—chip0~chip9. A plurality of lateral communication circuitry 501, 502, 601, 602 are configured for signal communication between chips.

While several embodiments have been described by way of example, it will be apparent to those skilled in the art that various modifications may be configured without departs from the spirit of the present invention. Such modifications are all within the scope of the present invention, as defined by the appended claims.

| Numerical system |
| --- |
| 10T first top metal pad |
| 1B first bottom metal pad |
| 1T first top metal pad |
| 20T second top metal pad |
| 2B second bottom metal pad |
| 2T second top metal pad |
| 30T third top metal pad |
| 501, 502 lateral communication circuitry |
| 503 top metal pad |
| 51 first left redistribution circuitry |
| 511 first right redistribution circuitry |
| 52 second left redistribution circuitry |
| 522 second right redistribution circuitry |
| 541, 542 chip |
| 543 underfill material |
| 544 molding compound |
| 56 supporting frame |
| 601, 602 lateral communication circuitry |
| 61 first left redistribution circuitry |
| 611 first right redistribution circuitry |
| 62 second left redistribution circuitry |
| 622 second right redistribution circuitry |
| 63 third left redistribution circuitry |
| 633 third right redistribution circuitry |
| 641, 642 chip |
| 643 underfill material |
| 644 molding compound |
| 66 supporting frame |
| D1 first dielectric layer |
| D10 first dielectric layer |
| D2 second dielectric layer |
| D20 second dielectric layer |
| D30 third dielectric layer |
| RDL1 first redistribution layer |
| RDL10 first redistribution layer |
| RDL2 second redistribution layer |
| RDL20 second redistribution layer |
| RDL30 third redistribution layer |

What is claimed is:

1. A package substrate, comprising:
   a first redistribution layer (RDL) configured according to a first design rule, and having:
      a first dielectric layer; and
      a first redistribution circuitry embedded in the first dielectric layer;
      wherein the first redistribution circuitry comprises a first left redistribution circuitry and a first right redistribution circuitry;
   a second redistribution layer (RDL) configured according to a second design rule and having:
      a second dielectric layer; and
      a second redistribution circuitry embedded in the second dielectric layer;
   wherein
      the second redistribution circuitry comprises a second left redistribution circuitry and a second right redistribution circuitry;
      the second left redistribution circuitry is configured on a bottom of the first left redistribution circuitry and electrically coupled to the first left redistribution circuitry; and
      the second right redistribution circuitry is configured on a bottom of the first right redistribution circuitry and electrically coupled to the first right redistribution circuitry; and
   a lateral communication circuitry configured according to the first design rule, in the first RDL and between the first left redistribution circuitry and the first right redistribution circuitry, wherein the lateral communication circuitry extends substantially parallel to a top surface of the second dielectric layer, wherein
      the lateral communication circuitry electrically couples the first left redistribution circuitry and the first right redistribution circuitry, and
      the second design rule has a lower circuitry density including a wider line width and a greater line thickness than those of the first design rule.

2. A package substrate as claimed in claim 1, wherein the second redistribution circuitry has a wider line width, greater line thickness, and lower circuitry density than those of the first redistribution circuitry and the lateral communication circuitry.

3. A package substrate as claimed in claim 1, further comprising:
   at least two chips, including:
      a left chip mounted on a top surface of the first left redistribution circuitry, and electrically coupled to the first left redistribution circuitry, and
      a right chip mounted on a top surface of the first right redistribution circuitry, and electrically coupled to the first right redistribution circuitry.

4. A package substrate as claimed in claim 3, further comprising:
   a supporting frame of a material selected from the group consisting of glass, ceramic, and silicon,
   wherein, in a top plan view of the package substrate, the supporting frame encircles the first RDL and the at least two chips.

5. A package substrate as claimed in claim 1, further comprising:
   a supporting frame of a material selected from the group consisting of metal, glass, ceramic, and silicon, the supporting frame configured on a top surface of the first RDL, wherein an entirety of the supporting frame is above the first and second RDLs.

6. A package substrate as claimed in claim 5, further comprising:
at least two chips including:
a left chip mounted on a top surface of the first left redistribution circuitry, and electrically coupled to the first left redistribution circuitry, and
a right chip mounted on a top surface of the first right redistribution circuitry, and electrically coupled to the first right redistribution circuitry,
wherein the supporting frame encircles the at least two chips, without overlapping the at least two chips in a thickness direction of the first and second RDLs.

7. A package substrate as claimed in claim 1, further comprising:
a supporting frame of a material selected from the group consisting of metal, glass, ceramic, and silicon, the supporting frame having at least a partial portion embedded in the first and second dielectric layers.

8. A package substrate as claimed in claim 7, further comprising:
at least two chips including:
a left chip mounted on a top surface of the first left redistribution circuitry, and electrically coupled to the first left redistribution circuitry, and
a right chip mounted on a top surface of the first right redistribution circuitry, and electrically coupled to the first right redistribution circuitry,
wherein
the supporting frame encircles at least the first redistribution circuitry, and
an entirety of the supporting frame is below the at least two chips.

9. A package substrate as claimed in claim 8, wherein a topmost surface of the supporting frame is flush with a topmost surface of the first dielectric layer of the first RDL.

10. A package substrate as claimed in claim 1, further comprising:
a third RDL configured according to a third design rule and having:
a third dielectric layer; and
a third redistribution circuitry embedded in the third dielectric layer;
wherein
the third redistribution circuitry comprises a third left redistribution circuitry and a third right redistribution circuitry;
the third left redistribution circuitry is configured on a bottom of the second left redistribution circuitry and electrically coupled to the second left redistribution circuitry; and
the third right redistribution circuitry is configured on a bottom of the second right redistribution circuitry and electrically coupled to the second right redistribution circuitry;
wherein
the third design rule has a lower circuitry density than the second design rule.

11. A package substrate as claimed in claim 10, wherein the third redistribution circuitry has a wider line width, greater line thickness, and lower circuitry density than the second redistribution circuitry.

12. A package substrate as claimed in claim 10, further comprising:
at least two chips, including:
a left chip mounted on a top surface of the first left redistribution circuitry, and electrically coupled to the first left redistribution circuitry, and
a right chip mounted on a top surface of the first right redistribution circuitry, and electrically coupled to the first right redistribution circuitry.

13. A package substrate as claimed in claim 10, further comprising:
a supporting frame of a material selected from the group consisting of metal, glass, ceramic, and silicon, the supporting frame configured on a top surface of the first RDL.

14. A package substrate as claimed in claim 13, further comprising:
at least two chips including:
a left chip mounted on a top surface of the first left redistribution circuitry, and electrically coupled to the first left redistribution circuitry, and
a right chip mounted on a top surface of the first right redistribution circuitry, and electrically coupled to the first right redistribution circuitry,
wherein the supporting frame encircles the at least two chips, without overlapping the at least two chips in a thickness direction of the first and second RDLs.

15. A package substrate as claimed in claim 10, further comprising:
a supporting frame of a material selected from the group consisting of metal, glass, ceramic, and silicon, the supporting frame having at least a partial portion embedded in the first and second dielectric layers.

16. A package substrate as claimed in claim 14, further comprising:
at least two chips including:
a left chip mounted on a top surface of the first left redistribution circuitry, and electrically coupled to the first left redistribution circuitry, and
a right chip mounted on a top surface of the first right redistribution circuitry, and electrically coupled to the first right redistribution circuitry,
wherein
the supporting frame encircles at least the first redistribution circuitry, and
an entirety of the supporting frame is below the at least two chips.

17. A package substrate as claimed in claim 1, wherein in a topmost metal layer embedded in the first dielectric layer of the first RDL,
the first left redistribution circuitry includes a left top metal pad,
the first right redistribution circuitry includes a right top metal pad, and
the lateral communication circuitry includes a top conductor physically and electrically connecting the left top metal pad and the right top metal pad.

18. A package substrate as claimed in claim 17, wherein in a lower metal layer below the topmost metal layer and embedded in the first dielectric layer of the first RDL,
the first left redistribution circuitry further includes a left lower metal pad,
the first right redistribution circuitry further includes a right lower metal pad, and
the lateral communication circuitry further includes a lower conductor physically and electrically connecting the left lower metal pad and the right lower metal pad.

19. A package substrate as claimed in claim 17, further comprising:
at least two chips, including:
a left chip mounted on a top surface of the first left redistribution circuitry, and electrically coupled to the first left redistribution circuitry, and a right chip mounted on a top surface of the first right redistribution circuitry, and electrically coupled to the first right redistribution circuitry, wherein the left top metal pad is electrically coupled to the left chip, and overlaps the left chip in a thickness direction of the first and second RDLs, and the right top metal pad is electrically coupled to the right chip, and overlaps the right chip in the thickness direction of the first and second RDLs.

20. A package substrate as claimed in claim 1, further comprising:

a supporting frame of a material selected from the group consisting of glass, ceramic, and silicon, wherein, in a top plan view of the package substrate, the supporting frame encircles the first RDL.

* * * * *